(12) United States Patent
Wicker

(10) Patent No.: US 7,579,210 B1
(45) Date of Patent: Aug. 25, 2009

(54) PLANAR SEGMENTED CONTACT

(75) Inventor: Guy Wicker, Southfield, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 12/054,919

(22) Filed: Mar. 25, 2008

(51) Int. Cl.
*H01L 21/00* (2006.01)

(52) U.S. Cl. .......................... 438/95; 438/102; 438/128; 438/637; 257/E31.029; 257/E29.296

(58) Field of Classification Search ................. 257/536, 257/2, 3, 42, E31.029, E29.296; 438/382, 438/95, 98, 102, 128, 637
See application file for complete search history.

(56) References Cited

U.S. PATENT DOCUMENTS

| | | | | |
|---|---|---|---|---|
| 4,203,123 | A * | 5/1980 | Shanks | 257/2 |
| 4,433,342 | A * | 2/1984 | Patel et al. | 257/2 |
| 6,586,761 | B2 * | 7/2003 | Lowrey | 257/3 |
| 6,613,604 | B2 * | 9/2003 | Maimon et al. | 438/95 |
| 7,151,273 | B2 * | 12/2006 | Campbell et al. | 257/3 |
| 2002/0160551 | A1 * | 10/2002 | Harshfield | 438/102 |
| 2003/0096497 | A1 * | 5/2003 | Moore et al. | 438/652 |
| 2003/0122166 | A1 * | 7/2003 | Lai | 257/246 |
| 2007/0210348 | A1 * | 9/2007 | Song et al. | 257/246 |
| 2007/0272950 | A1 * | 11/2007 | Kim et al. | 257/211 |
| 2008/0220560 | A1 * | 9/2008 | Klersy | 438/95 |

* cited by examiner

*Primary Examiner*—Thanh V Pham
*Assistant Examiner*—Duy T Nguyen
(74) *Attorney, Agent, or Firm*—Kevin L. Bray

(57) ABSTRACT

An electronic device including a planar segmented contact. A method for forming the device includes depositing a first insulator on a substrate, forming an opening in the first insulator, disposing a conductive material in the opening where the conductive material defines two or more conductive regions, forming a second insulator over the conductive layer, removing a portion of the second insulator to expose less than all of the conductive regions, recessing at least one of the exposed conductive regions, forming a third insulator over the recessed conductive region, and planarizing to expose at least one of the non-recessed conductive regions without exposing a recessed conductive region. An electrically stimulable material may then be formed over an exposed non-recessed conductive region.

19 Claims, 14 Drawing Sheets

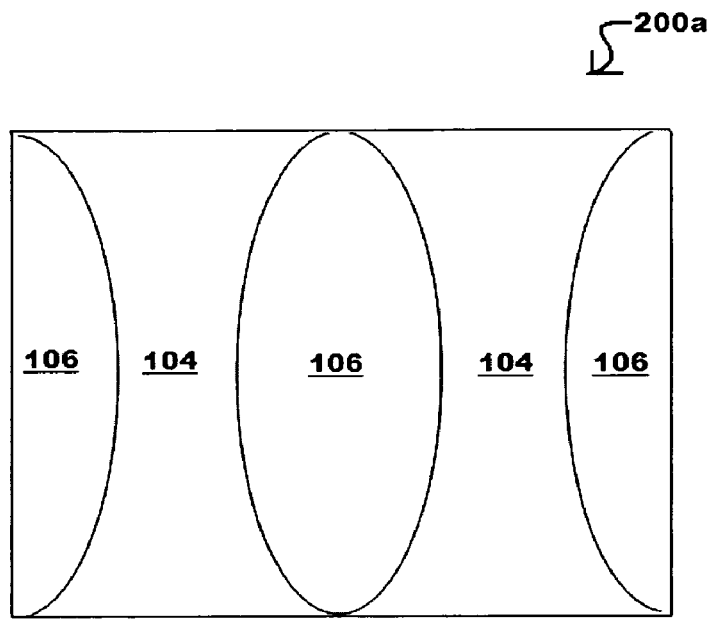
FIG. 9
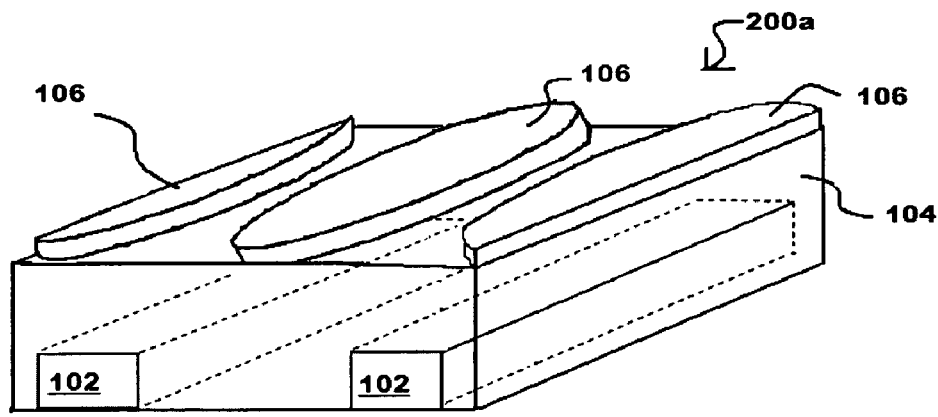
FIG. 10
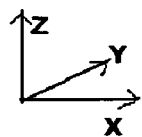

PLANAR SEGMENTED CONTACT

FIELD OF INVENTION

This invention relates generally to programmable resistance and switching devices having one or more electrical contacts with a lithographic or sublithographic dimension. More particularly, this invention relates to programmable resistance and switching device structures with contacts formed from a planarized segmented ring contact using lithography and conventional deposition methods. Most particularly, this invention relates to programmable resistance and switching devices with sublithographic contacts having reduced structural irregularities, improved conformality, and reduced programming currents.

BACKGROUND OF THE INVENTION

The use of programmable variable resistance materials in electronic devices is known in the art. The chalcogenides are an important class of programmable variable resistance materials. The principles of operation of chalcogenide materials and devices are described in U.S. Pat. No. 5,296,716, No. 5,341,328, No. 5,359,205, and No. 7,227,170, all to Ovshinsky et al., which are incorporated herein by reference. These patents are believed to evidence the state of the prior art and to represent current theory of operation and function of chalcogenide materials and chalcogenide-based memories known to those skilled in the art.

Briefly, variable resistance materials are materials that can be caused to change physical or electronic state, and therefore resistivity level, in response to an electrical input stimulus. By way of example, chalcogenide phase-change materials may be electrically stimulated to transform among structural states ranging from a predominantly crystalline state to a predominantly amorphous state. By controlling the amount of electrical energy applied to a chalcogenide phase-change material, the relative proportions of crystalline and amorphous phase content can be continuously varied from a low crystalline phase volume fraction to a high crystalline phase volume fraction. The resistivity of a chalcogenide phase-change material correlates with the crystalline phase volume fraction and progressively decreases as the crystalline phase volume fraction increases. A chalcogenide phase-change material may be predictably placed in a particular resistivity state by running a current of a certain amperage for a certain duration through it. The resistivity state so fixed will remain unchanged unless and until a current having a different amperage or duration within the programming range is run through the material.

Because of these unique characteristics, variable resistance memory materials may be used in memory cells for storing data in binary or higher-based digital systems. Such memory cells will normally include a memory element that is capable of assuming multiple, generally stable, states in response to the application of a stimulus. In most cases, the stimulus will be a voltage differential applied across the element so as to cause a predetermined current to flow through the memory element. A chalcogenide-based memory cell will typically include a chalcogenide memory element utilizing a chalcogenide phase-change material for storing data and an access element, coupled to the memory element, for use in programming and sensing the stored data. Embodiments of the access element include diodes, transistors, and Ovonic threshold switching devices.

Programmable resistance materials may be used as the active material of a memory device. Write operations in a memory device, also called programming operations, which apply electric pulses to the memory device, and read operations, which measure the resistance of the memory device, are performed by providing current or voltage signals across the two electrodes. The transformation between the relatively resistive state and relatively conductive state of a switching material is similarly induced by providing a current or voltage signal between two electrodes in contact with the switching material.

To achieve high density storage of data, memory arrays comprising a multitude of chalcogenide memory elements may be fabricated. In a memory array, a grid of conductive row lines (wordlines) and column lines (digit lines or bit lines) is formed in which a series combination of an access element and a chalcogenide memory cell is located at each junction of a row line and column line. The row lines and columns lines are connected to external circuitry (such as drivers or sense amplifiers) and individual memory cells are programmed or read by selective application of voltages to the row line and column line between which the memory cell is interconnected. Selection of the row line and column line of a particular memory cell produces a voltage differential that activates the access element, thus enabling current to pass through the memory element. Access elements at non-selected junctions of the array prevent stray current from altering the state of memory elements located at non-selected junctions.

Because of the unique operating characteristics of memories based on variable resistance memory elements, control of current flow is crucial to facilitate programming. Programming of chalcogenide phase-change materials, for example, requires high current densities.

One of the significant practical challenges that the programmable resistance memory and switching devices face is to reduce the contact area of one or more electrodes contacting the chalcogenide material. By reducing the contact area, the energy required to program a memory device or switch a switching device can be reduced and more efficient devices can be achieved.

Fabrication of semiconductor devices such as logic and memory devices typically includes a number of processes that may be used to form various features and multiple levels or layers of semiconductor devices on a surface of a semiconductor wafer or another appropriate substrate.

Physical (PVD) and chemical (CVD) vapor deposition methods, and also the deposition of conductive coatings through various decomposition processes of gaseous, liquid or solid precursors may be used in the formation of semiconductor devices.

Additional examples of semiconductor fabrication processes include chemical-mechanical polishing, etching, deposition, ion implantation, plating, and cleaning. Semiconductor devices are significantly smaller than a typical semiconductor wafer or substrate, and an array of semiconductor devices may be formed on a semiconductor wafer. After processing is complete, the semiconductor wafer may be separated into individual semiconductor devices.

In semiconductor device fabrication, it is desirable to reduce the length scale or feature size of devices as much as possible so that a larger number of devices can be formed on a given substrate area. As the feature size of devices is minimized, however, processing of the devices becomes more difficult. Small scale features become more difficult to define as the lithographic limit of resolution is reached and features that are defined become more difficult to process.

In this regard, it is desirable that a variable resistance memory cell include small areas of contact between the variable resistance material and the surrounding electrodes. It is further desirable to achieve small area electrode contacts in a planar configuration to facilitate subsequent deposition and adhesion of the variable resistance material to the electrode surface. Presently, the methods available for forming uniform, planar contacts are difficult to scale down to the size regime desired for minimizing programming currents. As a result, a tradeoff exists between electrode configuration and device current. While it is possible to make small contact areas, the uniformity and quality of the contact surface degrades as the contact area decreases. Conversely, achievement of uniform, planar contact surfaces requires relatively large contact areas that, in turn, lead to higher programming currents.

Also, practical size limits on the feature size of a device are controlled by the lithographic limit. From a device current perspective, it is desirable to have contact areas below the lithographic limits. Sublithographic dimensions, however, require complicated and expensive processing, thereby increasing the number and complexity of processing steps required for manufacture. Accordingly, there is a need for a stable and easily manufactured small contact area device with a planar electrode configuration. Such a device will demonstrate the advantages of variable resistance memory devices over competing memory technologies and further the goal of commercialization.

SUMMARY OF THE INVENTION

The invention provides an electronic device including a planar segmented contact structure having lithographic or sublithographic dimensions in electrical communication with a memory element.

The memory device is easily constructed using conventional techniques and includes masking steps. In this way, a highly effective memory device can be easily and efficiently created for delivering a suitable programming current to the memory element, while minimizing the size of the memory cell.

Also disclosed is a method for forming an electronic device with a planar segmented contact structure. The method includes providing a substrate, the substrate including a first conductive material and a first insulator formed over the first conductive material, the first insulator having an opening, the opening exposing the a top surface of the first conductive material, the opening having a first sidewall surface and a second sidewall surface; forming a second conductive material over the opening, the second conductive material contacting the first sidewall surface to form a first conductive region, the first conductive region contacting the first conductive material and extending to a first height above the first conductive material, the second conductive material contacting the second sidewall surface to form a second conductive region, the second conductive region contacting the first conductive material; forming a second insulator material over the second conductive material, the second insulator material filling or occupying the opening; and removing a portion of the second insulator material disposed above the second conductive region to expose the second conductive region without exposing the first conductive region.

An electronic device formed by the method disclosed herein includes a substrate, the substrate including a first conductive material and a first insulator formed over a portion of the first conductive material, the first insulator including a recessed portion having a first sidewall surface and a second sidewall surface; a second conductive material formed over the recessed portion, the second conductive material contacting the first sidewall surface to form a first conductive region, the first conductive region contacting the first conductive material and extending to a first height above the first conductive material, the second conductive material contacting the second sidewall surface to form a second conductive region, the second conductive region contacting the first conductive material and extending to a second height above the first conductive material below the first height; a second insulator material formed over the second conductive region, the second insulator material disposed within the recessed portion; and a planar top surface, the planar top surface being positioned at a third height above the first conductive material, the third height being above the second height.

For a better understanding of the instant invention, together with other and further illustrative objects thereof, reference is made to the following description, taken in conjunction with the accompanying drawings and claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5 through 24 show a process for making a memory cell in accordance with an embodiment of the invention.

DETAILED DESCRIPTION OF ILLUSTRATED EMBODIMENTS

Figure 1:
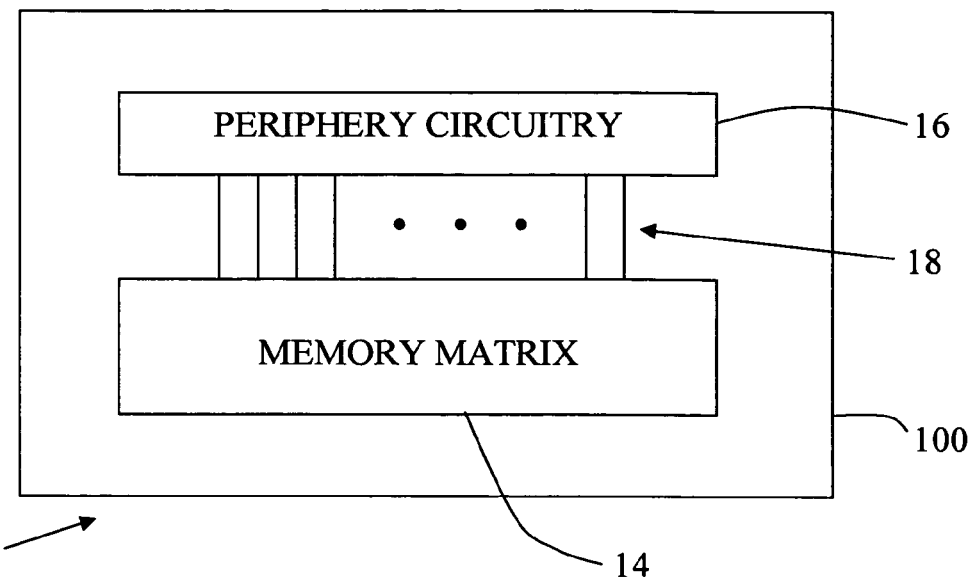
FIG. 1 shows a high-level diagram of a memory device in accordance with an embodiment of the invention including a memory array and periphery circuitry formed on a substrate.

In the following paragraphs and in association with the accompanying figures, examples of memory devices formed according to embodiments of the invention are disclosed. Specific embodiments of memory elements and methods of making such memory elements are described below as they might be implemented for use in semiconductor memory circuits. In the interest of clarity, not all features of an actual implementation are described in this specification. Additionally, like elements will be referred to with like numbers throughout description of several embodiments of the invention.

The invention relates to planarized segmented lower contacts that are flush with a planar surface adapted to receive a memory material such as a variable resistance memory material in a subsequent deposition step.

A method of the invention forms the planarized segmented lower contacts. The method first forms a lower electrode, deposits a first insulating layer thereon, uses a patterned wall mask and etch chemistry to remove a portion of the first insulating layer and to define a first opening and to expose the lower electrode; the first opening having one or more sidewall surfaces defined by the first insulating layer and a bottom defined by an upper surface of the lower electrode; deposits a thin conductive layer over the first insulating layer and into the first opening to cover at least portions of the first opening sidewalls and bottom; deposits a second insulating layer to cover the thin conductive layer and fill the first opening; patterns the second insulating layer using a segment mask; etches the unmasked portion of the second insulating layer along with a portion of the thin conductive layer and a portion of the first insulating layer to expose a sidewall portion of the thin conductive layer; deposits a third insulating layer over the exposed sidewall portion of the thin conductive layer and the etched portions of the first and second insulating layers; and planarizes each of the first, second, and third insulating layers and the conductive layer to form a planarized surface including segmented ring electrode or contact. The electrode formed by the instant invention may be referred to herein as a segmented electrode, segmented contact, segmented ring electrode, segmented ring contact or a similar term. More generally, the electrode provided by the instant invention is a perimeter or partial perimeter electrode having a shape governed by the geometry of an underlying opening. The underlying opening may be round (e.g. circular or elliptical), rectilinear (e.g. trench), or other shape. The instant segmented electrode may thus be round or non-round in shape and may form an enclosed or non-enclosed (e.g. arc, line, segment) structure.

In an embodiment of the invention, a horizontal top surface of the conductive layer is removed whereby an upper edge of the conductive sidewall forms the segmented ring contact. The resulting structure includes the planarized surface adapted to receive a subsequently deposited programmable resistance material including the segmented ring contact defining a contact area.

The invention eliminates the need for subphotolithographic processing techniques typically required to form sublithographic features typically associated with forming memory cells.

In an embodiment of the invention, a programmable resistance material is deposited on top of the planarized surface including the planar segmented electrode. In another embodiment of the invention, additional masking steps may be used to further reduce the contact area by reducing the exposed surface area of the segmented contact, thereby permitting a further reduction in the current required to program a subsequently formed variable resistance or memory layer.

A method in accordance with an embodiment of the invention reliably forms the segmented contact structure and operates to reduce programming current and increase current density within the device. The segmented contact defines a small area electrode on a planar surface. The small area electrode enables operation of a low current device. The planar surface enables more reliable behavior due to deposition of a programmable resistance material free from gaps or voids that may cause inconsistent behavior. Low current operation may be achieved along with the more reliable behavior.

Turning now to the drawings, and referring initially to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2:
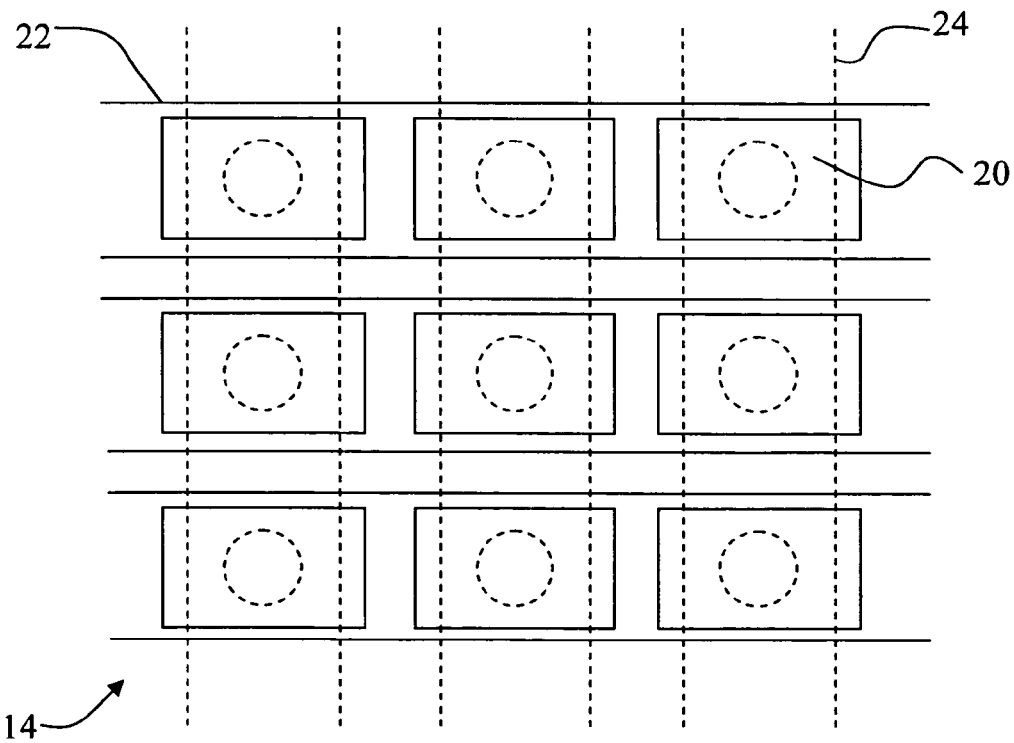
FIG. 2 shows a high-level diagram of a memory array in top view in accordance with an embodiment of the invention.

A top view of the memory array 14 is shown in FIG. 2. As can be seen, the memory array includes a plurality of memory cells 20 that are arranged in generally perpendicular rows and columns. As can be seen, the memory array 14 includes a plurality of memory cells 20 that are arranged in generally perpendicular rows along an x-direction and columns along a y-direction. The memory cells 20 in each row are coupled together by a respective wordline 22, and the memory cells 20 in each column are coupled together by a respective bitline 24.

Figure 3:
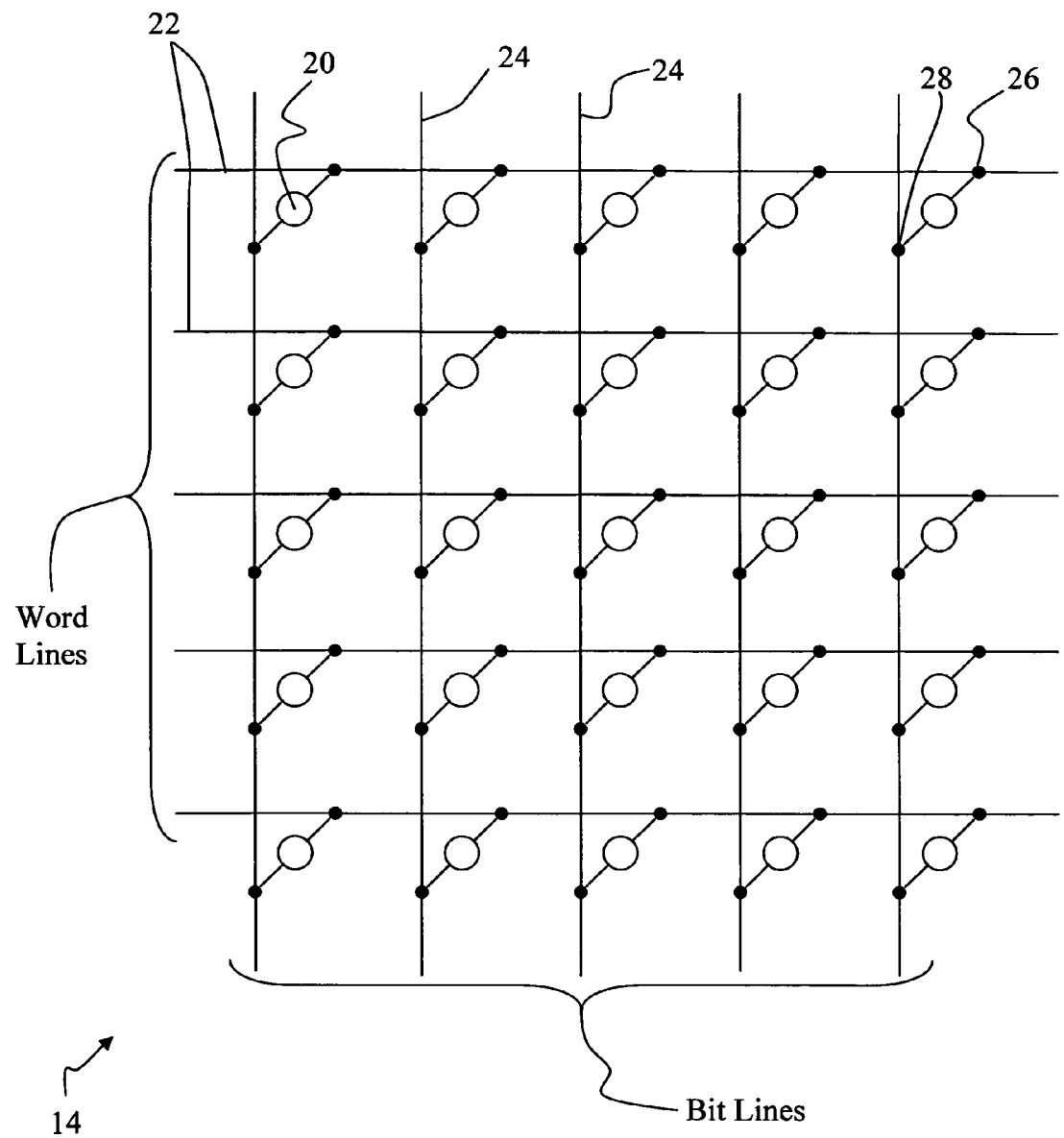
FIG. 3 is a schematic diagram of a memory array in accordance with an embodiment of the invention.

A schematic diagram of the memory array 14 is shown in FIG. 3. Memory array 14 comprises a plurality of horizontally disposed wordlines or rowlines 22 and vertically disposed bitlines or columns 24. As used herein, the terms wordline and rowline are used interchangeably. Each memory cell is disposed between a wordline and a bitline. As can be seen, each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 4:
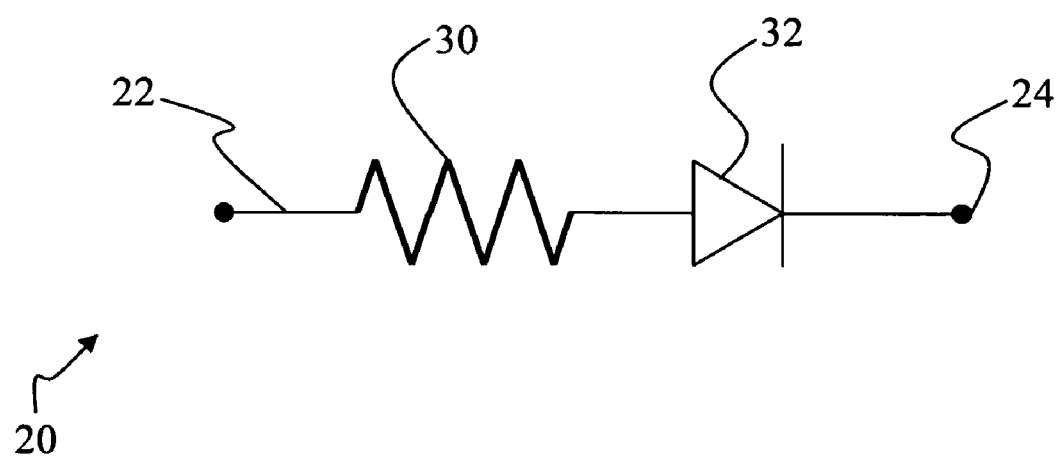
FIG. 4 is a schematic diagram of a memory cell incorporating a programmable resistance memory material.

FIG. 4 illustrates an exemplary memory cell 20 that may be used in the memory array 14. The memory cell 20 includes a programmable resistance element 30 which is coupled to an access device 32. The access device electrically isolates each memory element from all other memory elements in the array. The access device may also be referred to herein as an isolation device, selection device, or select device. In the embodiment of FIG. 4, the memory element 30 is illustrated as a programmable resistance element, and the access device 32 is illustrated as a diode.

Also, any conductive material capable of contacting a programmable resistance element having a variable threshold voltage or variable resistivity such as, but not limited to, phase change materials, pnictide materials and resistive oxides may be used. The programmable resistance element may be made of a chalcogenide material, as will be more fully explained below. The memory elements of the invention may be electrically coupled to access devices and addressing lines in order to form a memory array. The access devices permit each discrete memory cell to be read and written to without interfering with information stored in adjacent or remote memory cells of the array.

As illustrated in FIG. 4, the memory element 30 is coupled to a wordline 22, and the access device 32 is coupled to a bitline 24. However, it should be understood that connections of the memory element 20 may be reversed without adversely affecting the operation of the memory array 14.

Figure 22:
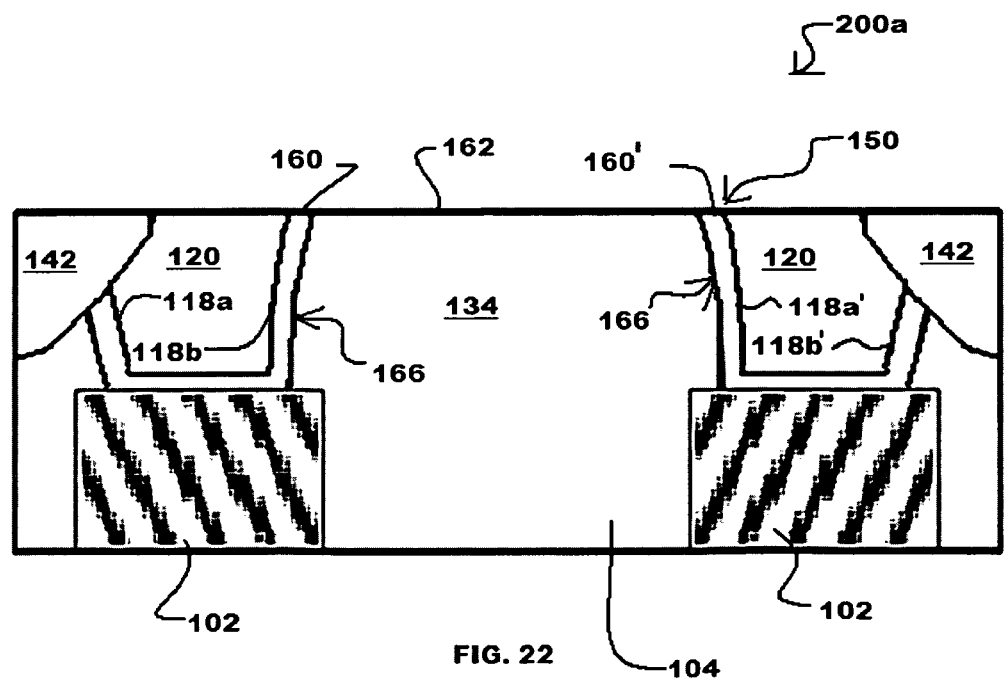
Figure 23:
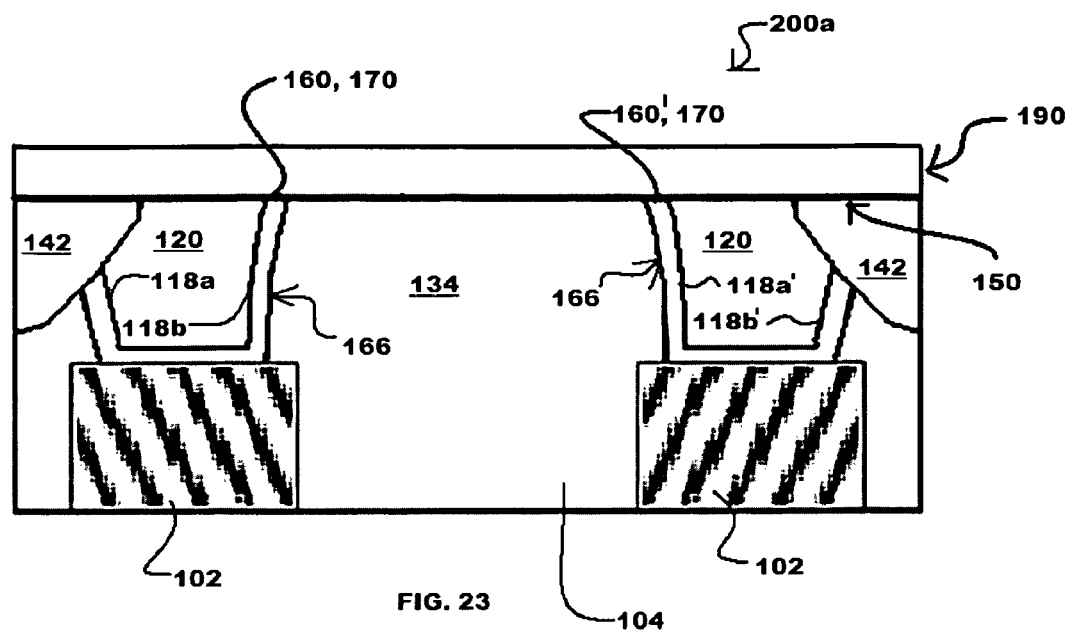
Figure 24:
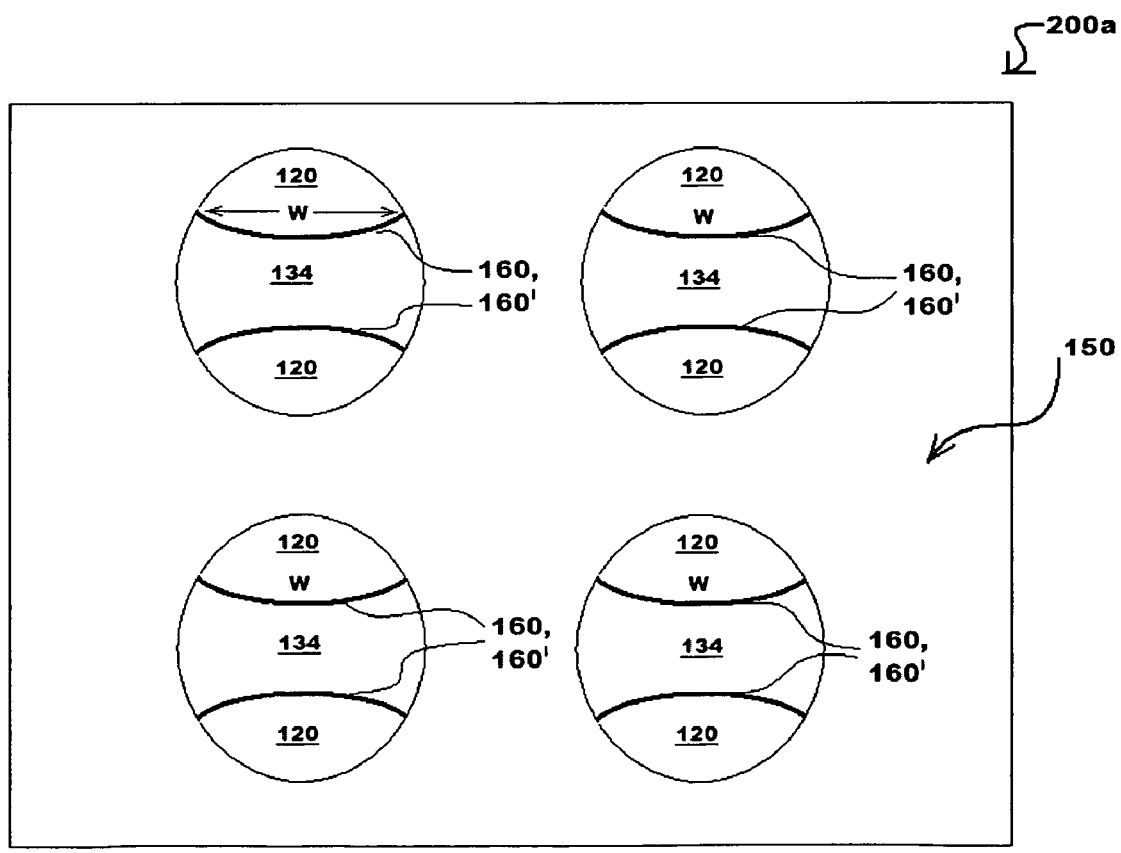
Figure 25:
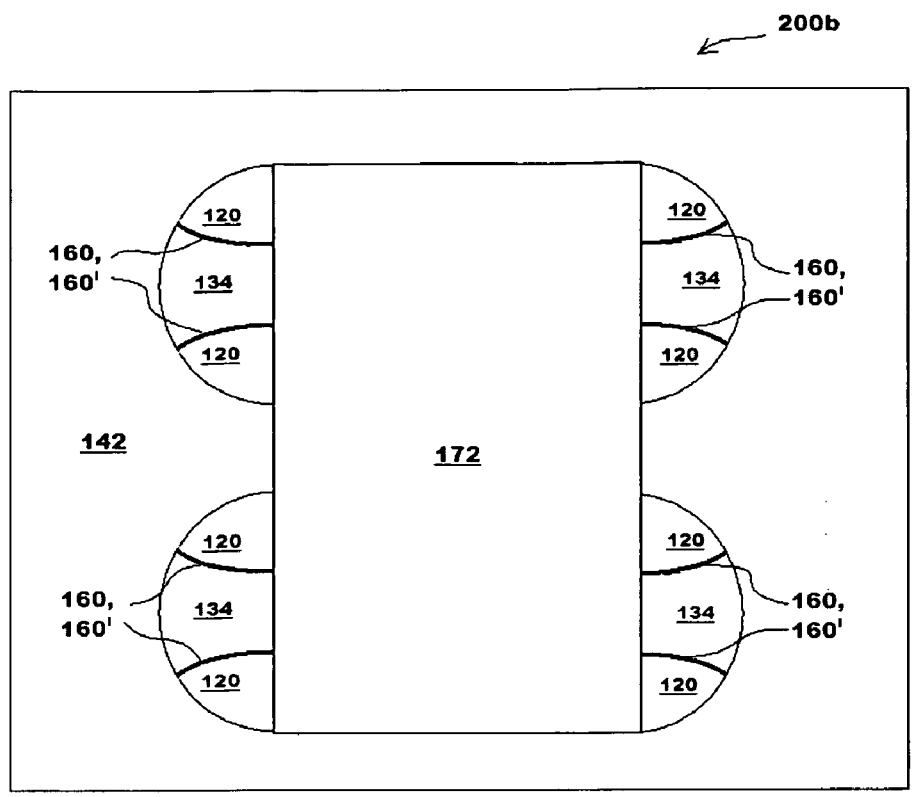
FIGS. 25 through 26 show a process for making an embodiment of the memory cell in accordance with an embodiment of the invention.
Figure 26:
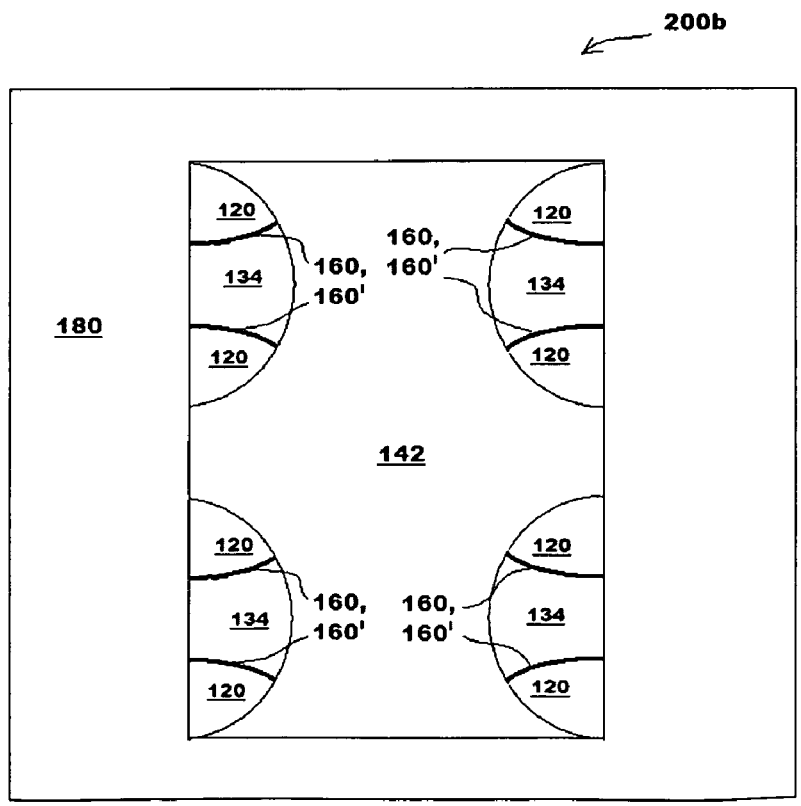

The actual structure of exemplary portions of memory cells 20 are illustrated in FIGS. 23-24, and 26 respectively, while a method for fabricating each of the memory cells 20 is described with reference to FIGS. 5-26. It should be understood that while the fabrication of only single memory cells 200a, 200b is discussed below, a plurality of similar memory cells may be fabricated simultaneously (e.g. across a wafer). Although not illustrated, each memory cell is electrically isolated from other memory cells in the array in any suitable manner, such as by the addition of insulating regions such as embedded field oxide regions between each memory cell.

Figure 5:
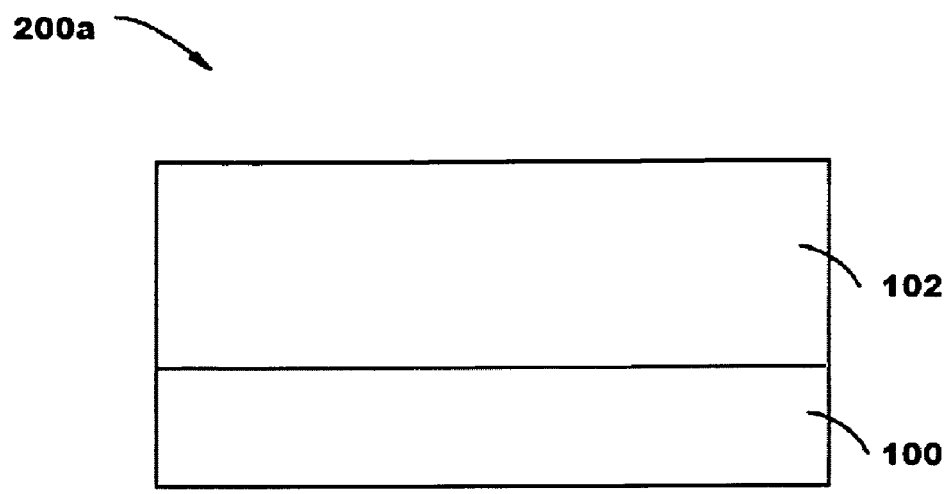

Each memory cell 20 is physically and electrically disposed in series between a bitline and a wordline. Referring first to FIG. 5, a semiconductor substrate 100 is provided. The substrate 100 may include wordlines or rowlines 102 defining a lower electrode formed thereon with a first insulating layer 104 deposited between each rowline 102 on the substrate 100 (see FIG. 7). In an embodiment of the invention, a contact may be formed above the rowline or electrode 102. While it is understood that each of the portions of memory cells 20 are shown in several embodiments of process flows in FIGS. 5-26, the substrate 100, while only shown in FIGS. 5-6, respectively, is an integral part of each of the cells 20. Each memory cell on the memory array is formed on substrate 100.

FIGS. 5-26 illustrate initial steps of a process flow of fabrication of a memory cell 20 that includes a segmented lower ring contact in an embodiment of the invention.

FIGS. 5-26 illustrate the memory cell 20 at successive intermediate stages of development.

Figure 6:
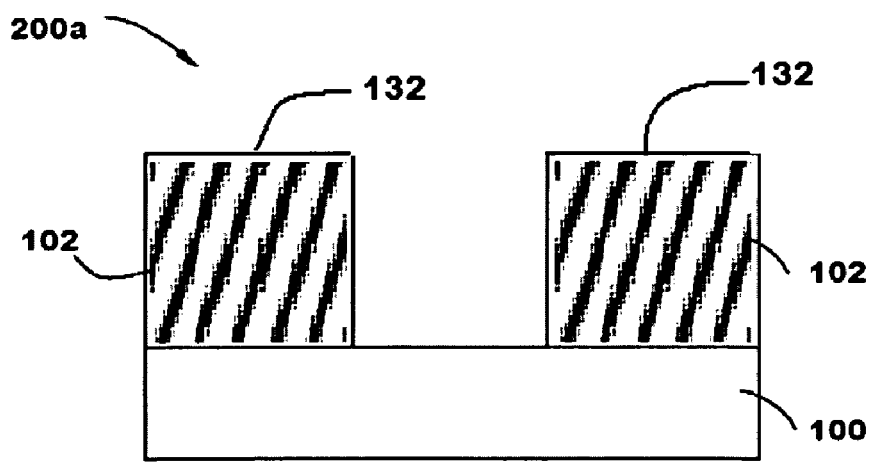

Initially, as illustrated in FIGS. 5-6, a bottom rowline or lower electrode material is formed over substrate 100 and patterned to define one or more rowlines 102. The lower electrode 102 has a top surface 132. In an embodiment of the invention, rowline 102 is formed from a conductive material that has a resistivity which is less than the resistivity of a subsequent and adjacent insulating layer 104 (see FIG. 7). In an embodiment of the invention, rowline 102 is a patterned rowline (e.g. a damascene structure with Cu or other metal) or a subtractive rowline (e.g. Al or other metal, heavily doped polysilicon, a silicide, or the like). Examples of the materials that may be used to form rowline 102 include, but are not limited to Cu, Al, other metal, polysilicon, silicon carbide, tungsten, titanium tungsten, tungsten silicide, other metal silicides, molybdenum, molybdenum nitride, and titanium nitride. In the case of polysilicon or silicon carbide, heavy n-type or p-type doping is recommended to provide sufficient conductivity.

Figure 7:
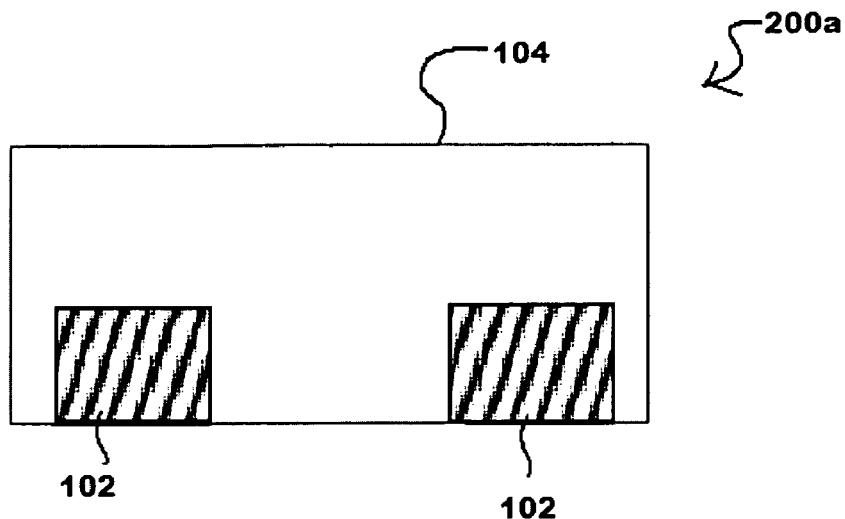
Figure 8:
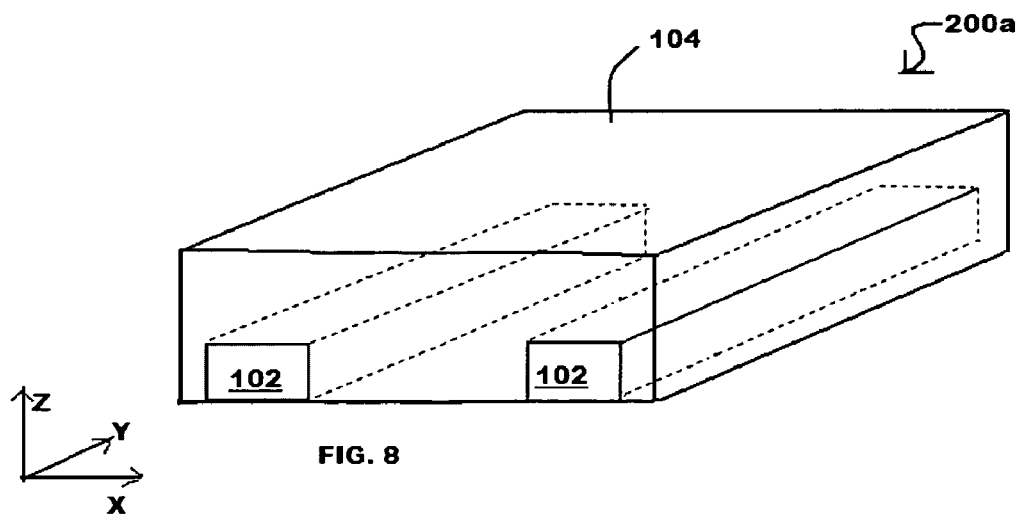

After patterning to form rowlines 102, as shown in FIGS. 7-8, a first insulating layer 104 may be deposited on the substrate 100 to fill between each rowline 102 and then may be planarized by a suitable process such as chemical mechanical polishing (CMP).

The first insulating layer 104 may be formed in any suitable manner, such as by chemical vapor deposition (CVD), physical vapor deposition, chemical vapor deposition, metal organic chemical vapor deposition (MOCVD), atomic layer deposition (ALD), sputtering or evaporation. The first insulating layer 104 is preferably chosen to have good thermal insulation properties to minimize the rate of heat loss from, and programming energy of, a subsequently deposited programmable resistance material (see below). The insulating layer 104 may also operate to decrease the rate at which thermal energy flows from the lower electrode 102 to the surrounding structure to facilitate more effective retention of heat within the subsequently deposited programmable resistance material.

In an embodiment of the invention, the first insulating layer material defines a thermal insulation layer and may be formed from silicon nitride or silicon dioxide. The first insulating layer material may also be formed of dielectric materials, including one or more materials selected from the group consisting of oxides, nitrides, oxynitrides, carbonitrides, fluorides, sulfides, chlorides, carbides, borides, phosphides, and mixtures or alloys thereof. In another embodiment of the invention the first insulating layer material may include an organic dielectric material. Further examples of thermal insulation layer materials include spin-on glass, spin-on polymer, sol-gel materials, or other solution-deposited insulators. Silica is still another example of a thermally insulating material that may be used to form the first insulating layer 104.

FIGS. 5-26 illustrate intermediary processing steps of a memory cell fabrication process. In the embodiments shown in FIGS. 7-26, subsequent layers above the rowlines 102 and first insulating layer 104 are raised above the substrate 100 and are remote to the substrate 100.

Referring to FIGS. 9-10, the first insulating layer 104 is then appropriately masked with a patterned disposable sidewall mask 106. In an embodiment of the invention, the sidewall mask 106 is formed from silicon nitride or silicon-rich silicon nitride. In another embodiment of the invention the sidewall mask 106 is formed from a polyimide or other polymeric material.

In an embodiment of the invention, a selective etch of the disposable sidewall mask 106 relative to a portion of the first insulating layer 104 may be either a wet chemical etch or dry plasma etch. In an embodiment of the invention, wherein the sidewall mask material is a polyimide or other polymeric material, selective etching of the first insulating layer 104 may be accomplished with an $O_2$ plasma etch. In another embodiment of the invention, wherein the sidewall mask 106 is formed from a silicon nitride material and selective etching of the first insulating layer 104 may be accomplished with a phosphoric acid based wet etch. In another embodiment of the invention, the silicon nitride sidewall mask 106 may be preferentially etched relative to oxides with a $SF_6$ based plasma etch chemistry.

In another embodiment of the invention, the first insulating layer 104 may be anisotropically etched.

FIG. 9 is a top plain view of the memory cell device 200a and shows patterned sidewall mask 106 formed over the top surface of first insulating layer 104. FIG. 10 illustrates a perspective view of the memory cell device 200a with patterned sidewall mask 106. Sidewall mask 106 overlies portions of the top surface of first insulating layer 104 and prevents removal of those portions during a subsequent etch step (see below). The unmasked portions of first insulating layer 104 are susceptible to etching and define regions where openings can be formed. The shape of the openings is governed by the pattern used to form sidewall mask 106. The cross-sectional shape of an opening may be round, curved, linear, polygonal, or bent. The shape of sidewall mask 106 shown in FIGS. 9 and 10 is intended to be illustrative only and does not limit the scope of the instant invention. The full range of patterns and shapes of masks known in the art are within the scope of the instant invention.

Figure 11:
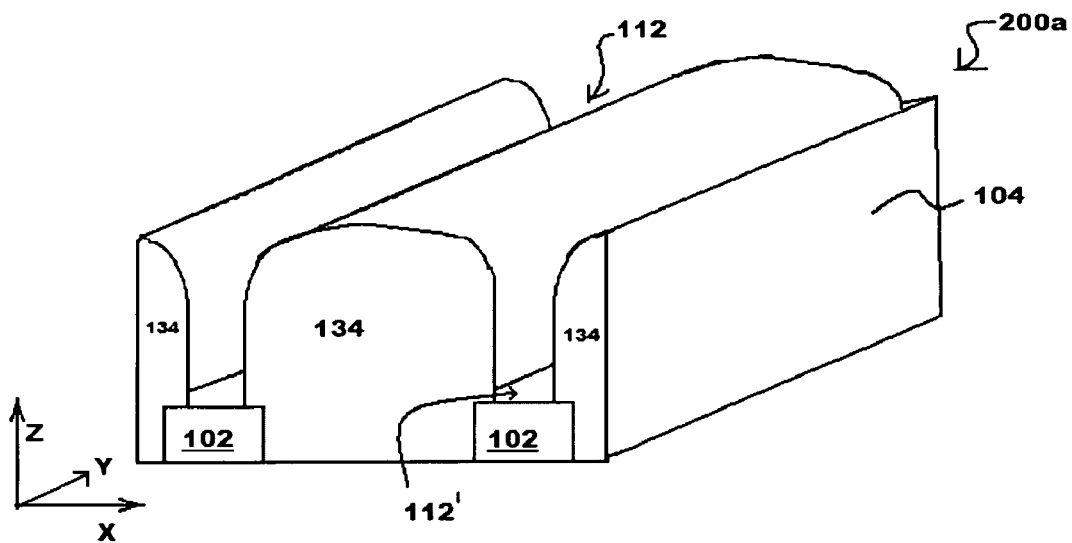
Figure 12:
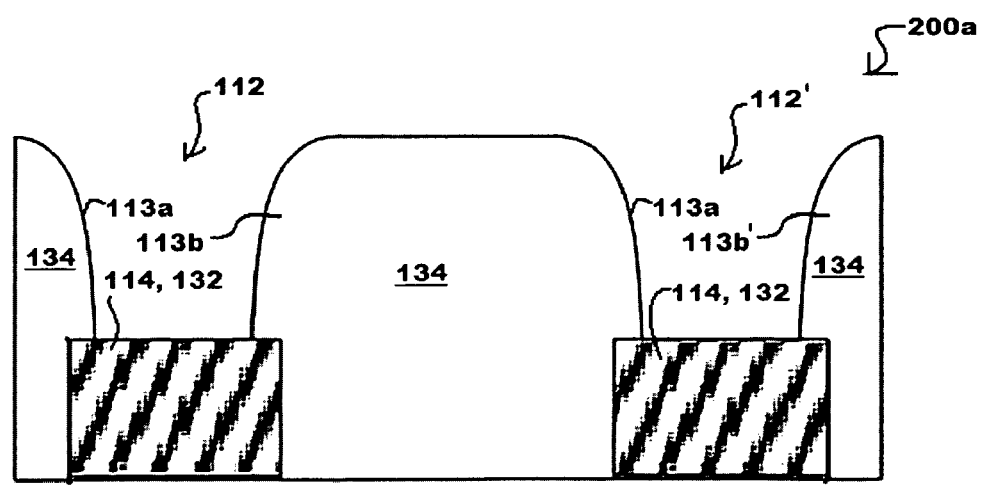
Figure 13:
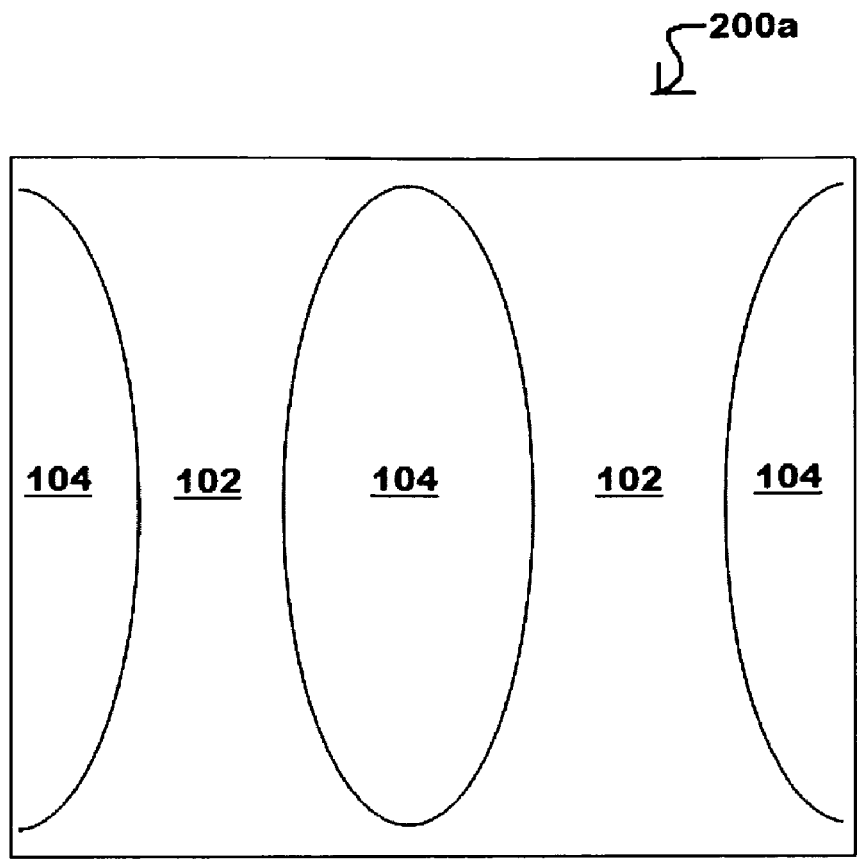

As shown in FIGS. 11-13, etch chemistry may then be used to remove the first insulating layer 104 until reaching the top surface 132 (shown in FIGS. 6 and 12) of the lower electrode or rowline 102. FIGS. 11, 12, and 13 respectively illustrates a partial perspective, a side elevational cross-sectional, and a top view of the device 200a of FIGS. 9-10 etched to define a first opening or openings 112, 112'. As used herein, reference to "a first opening" may refer to one or more similarly formed first openings. Any type of known etch process including an anisotropic or an isotropic etch process may be used to expose the lower electrode 102. The first insulating layer 104 is etched to form the first opening 112, 112' in the first insulating layer 104 to expose the conductive lower electrode 102. After etching, the remaining portions of first insulative layer 104 disposed between adjacent lower electrodes 102 defines first insulating layer spacer regions 134 having sidewall surfaces utilized to support additional layers in subsequent deposition steps (see below). The first openings 112, 112' are defined by corresponding sidewall surfaces 113a, 113b (corresponding to first opening 112), 113a', 113b' (corresponding to first opening 112'), respectively, and by a bottom surface 114 (corresponding to the portion of the top surface 132 of lower electrode 102 exposed by etching). Generally, the first opening 112, 112' may be any shape that is bounded by the sidewall surfaces 113a, 113b, and 113a', 113b', respectively of the first insulating regions 134 and the lower electrode top surface 132. For example, the first opening 112, 112' may be formed as a substantially rectangular hole or pore having concave or arcuate shaped sidewalls as viewed from a top view of the device 200a shown in FIG. 13. In other embodiments of the invention, the first opening 112, 112' may be formed as an ellipsoidal, or a circular hole or pore. Alternately, the first opening 112, 112' may be formed as a trench, channel or groove.

First opening 112 includes first sidewall surface 113a and second sidewall surface 113b. First sidewall surface 113a and second sidewall surface 113b may be discrete regions on a common sidewall of opening 112 or discrete regions on distinct sidewalls of opening 112. Sidewall surfaces are discrete when they are non-overlapping and non-contacting. Alternatively, first sidewall surface 113a and second sidewall surface 113b may be contiguous regions on a common sidewall of opening 112. Sidewall surfaces are contiguous if they overlap or have contacting boundaries.

If opening 112 is a circular hole, for example, opening 112 may include a single circumferential sidewall where first sidewall surface 113a and second sidewall surface 113b are discrete regions thereon. Alternatively, first sidewall surface 113a and second sidewall surface 113b may be contiguous along the circumferential sidewall.

If opening 112 is a trench or channel, in another example, opening 112 may include two or more distinct sidewalls. A rectangular trench or channel, for example, may include a left sidewall opposed from a right sidewall. If opening 112 is a trench or channel, first sidewall surface 113a and second sidewall surface 113b may be discrete regions on the same sidewall (e.g. left sidewall) or discrete regions on different sidewalls (e.g. first sidewall surface 113a may be located on the left sidewall of a trench and second sidewall surface may be located on the right sidewall of a trench). Alternatively, first sidewall surface 113a and second sidewall surface 113b may be contiguous regions on the same sidewall of an opening having two or more sidewalls.

Figure 14:
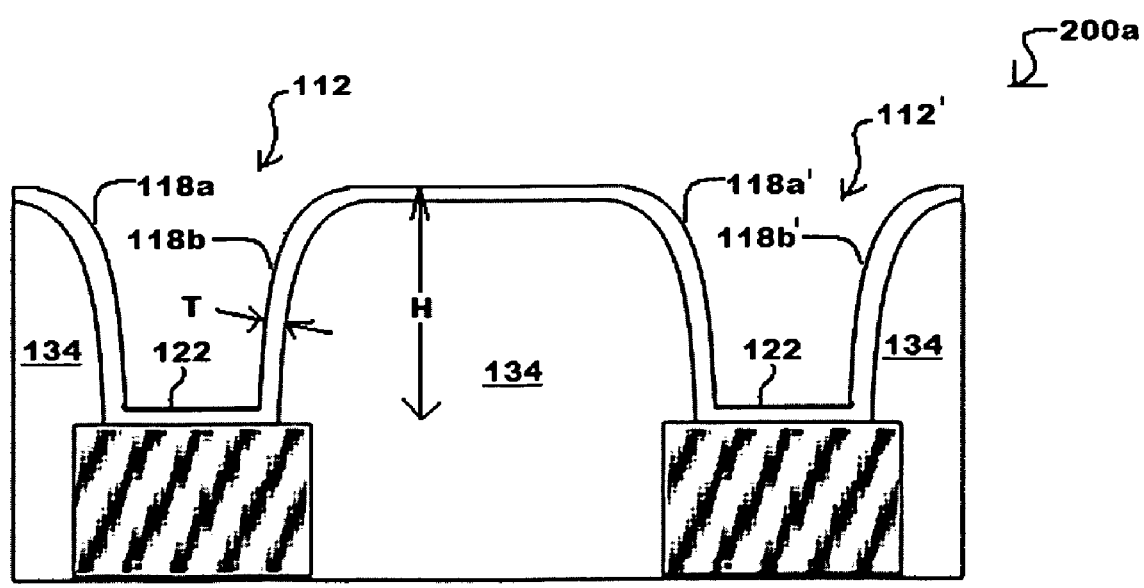
Figure 15:
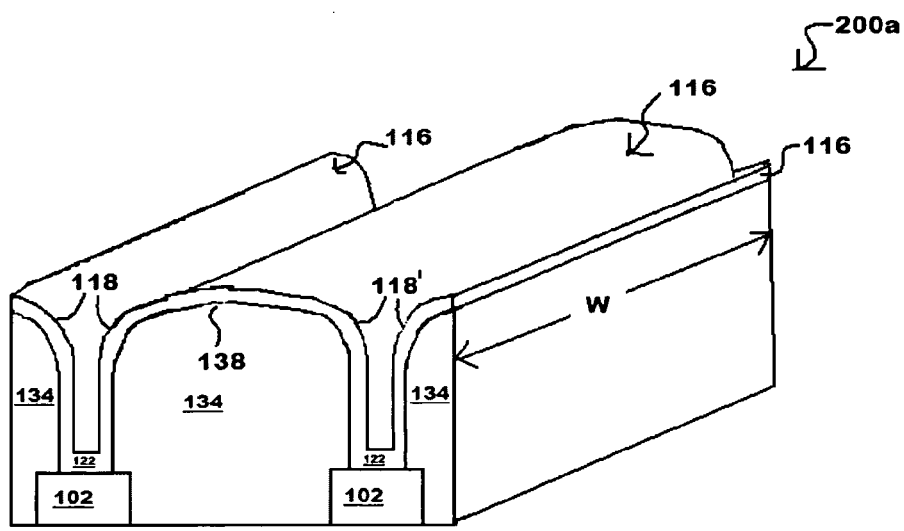
Figure 15:
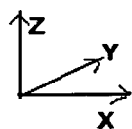

Once the first opening 112, 112' is defined, a thin conductive layer 116 is conformally deposited over the device structure to form the structure 200a shown as a partial cross-sectional elevational view and as a perspective view in FIGS. 14-15, respectively. In an embodiment of the invention, the deposition is substantially conformal deposition. The conformal deposition of the conductive layer may be done using chemical vapor deposition, physical vapor deposition, chemical vapor deposition, metal organic chemical vapor deposition (MOCVD), atomic layer deposition (ALD), sputtering or evaporation. Other possible deposition methods may be used as long the thin conductive layer when deposited onto the top surfaces of the first insulating layer 104 substantially covers each of the entire first insulating layer spacer regions 134 including the sidewall surfaces 113a, 113b, and 113a', 113b', respectively of the first opening 112, 112' surrounding the first opening 112, 112' and onto the bottom surface 114 of the first opening 112, 112'. Hence, portions of the thin conductive layer 116 are deposited along the sidewall surfaces 113a, 113b, and 113a', 113b' of the first openings 112, 112', respectively, to form conductive sidewalls 118, 118' wherein the geometry of the conductive sidewalls 118, 118' is the same geometry as that of the first opening sidewalls 113a, 113b, and 113a', 113b', respectively. As used herein, the terminology "conductive sidewall" refers to one or more similarly formed conductive sidewalls. The conductive sidewalls 118, 118' defines conductive spacers 118a, 118b, and 118a', 118b', respectively, disposed along the inner sidewall surfaces 113a, 113b and 113a', 113b', respectively, of the first openings 112 and 112' and operates to narrow the width dimensions of the first openings 112 and 112' and to further reduce a contact area.

FIG. 15 is an idealized three-dimensional representation of the device 200a including each conductive sidewall spacers 118a, 118b, and 118a', 118b' having an initial associated first height "H", a thickness "T" equal to a thickness of the conductive layer 116, and a width dimension "W". The thickness "T" of the conductive sidewall spacers 118a, 118b, 118a', 118b' is the dimension normal to underlying deposition surfaces 113a, 113b, 113a', 113b' and 114 of each spacer. The first height "H" is the distance above the bottom surface 114 of the first openings 112, 112', respectively and sidewall spacers 118a', 118b each define a first conductive region extending to the first height "H" above the bottom surface 114. The width "W" is the lateral dimension of the conductive spacer along the y-axis in the y-z plane (perpendicular to the plane of the illustration of FIG. 14).

A conductive bottom portion 122 of the conductive layer 116 deposited within the first openings 112, 112' electrically contacts the top surface 132 of lower electrode 102. The portions of the thin conductive layer 116 deposited within the first openings 112, 112' including conductive sidewall spacers 118a, 118b, and 118a', 118b', respectively and conductive bottom portion 122 of the conductive layer 116 remaining after completion of fabrication steps shown in FIGS. 14-22, and 24 define a planar segmented ring electrode or contact 166 (see below).

Generally, the material forming the conductive layer 116 may be any conductive material that operates as a good contact to a programmable resistance material. The conductive layer 116 may include one or more elements selected from the group consisting of Ti, V, Cr, Zr, Nb, Mo, Hf, Ta, W, and mixtures or alloys thereof, and one or more elements selected from the group consisting of B, C, N, O, Al, Si, P, S, and mixtures or alloys thereof. Examples of materials include metal nitrides such as titanium nitride, titanium aluminum-nitride, titanium carbon-nitride, titanium silicon nitride, tantalum nitride, tantalum silicon nitride, and molybdenum nitride. Other examples of materials include amorphous carbon, amorphous silicon or a dual amorphous carbon/amorphous silicon structure. In other embodiments of the invention, the conductive layer material may be a metal, a metal alloy or a doped polysilicon. Examples of materials which may be used for the conductive layer include, but are not limited to such as n-type doped polysilicon, p-type doped polysilicon, p-type doped silicon carbon alloys and/or compounds, n-type doped silicon carbon alloys and/or compounds, titanium-tungsten, tungsten, tungsten silicide, and molybdenum.

A cross-sectional portion of the conductive layer 116 having the thickness "T" (shown in FIG. 14) defines a contact area (as discussed further below), and thus, the thinner the conductive layer 116 is, the smaller the contact area may be formed, and therefore the less programming current is needed to ultimately program the device. In an embodiment of the invention, the thickness of the conductive layer 116 is between about 20 and 100 Angstroms.

The conductive layer 116 is sufficiently conductive to permit current flow from the lower electrodes 102 to subsequently formed layers (including a variable resistance layer) formed above the conductive layer 116.

The conductive layer 116 may also serve as a heater layer to transfer thermal energy into a subsequently formed variable resistance memory layers. The Joule heating that occurs as current passes through the conductive layer 116 provides a source of energy that may be used to influence the programming of thermally sensitive variable resistance memory layers (e.g. phase-change layers).

Figure 16:
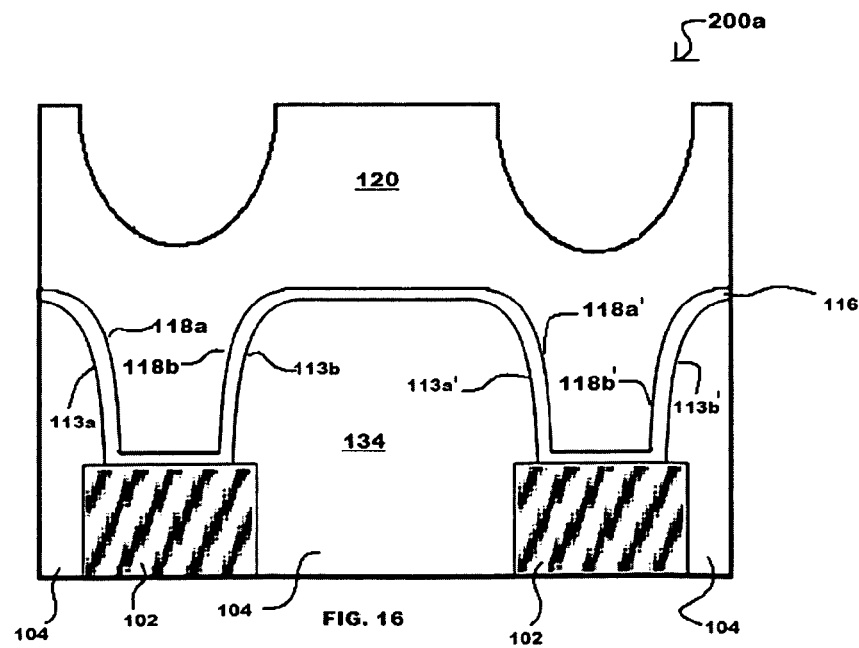

In an embodiment of the invention, shown in FIG. 16, a second insulating layer 120 is next deposited over the memory cell structure 200a of FIGS. 14-15. In the embodiment of the invention shown in FIG. 16, a second insulating layer 120 may be deposited on top of the conductive layer 116 to conformally cover the conductive layer 116 including occupying or filling the first opening 112 and the ring electrode contact of the conductive layer 116. In other embodiments, second insulating layer 120 may non-conformally cover conductive layer 116.

Referring to FIG. 16, it is seen that the second insulating layer material deposited into the first openings 112 and 112' and on top of the conductive layer 116 of structure 200a of FIGS. 14-15 forms the structure 200a of FIG. 16. In an embodiment of the invention, the dimension of the second insulative layer is between 100 and 1500 Angstroms.

In an embodiment of the invention, the processing steps associated with forming the second insulating layer 120 are analogous to those described hereinabove for forming the first insulative layer 104. The second insulating layer 120 may be formed from any of the materials identified hereinabove to form the first insulating layer 104 such as a thick oxide fill.

In another embodiment of the invention, the deposition of the second insulating layer 120 may be done with an insulating fill material such as, but not limited to a high density plasma (HDP) oxide. The HDP deposition technique is particularly effective because it is more conducive to filling the spaces between the first insulative layer regions 134 than techniques such as sputtering. CVD and other conformal techniques provide a similar benefit and also facilitate dense filling of high aspect ratio features.

The second insulating layer 120 operates as barrier layer to prevent or limit interdiffusion of atomic species between the conductive layer 116 and subsequently formed layers (e.g. variable resistance layer) in the device structure. The structure 200a of FIG. 16 is then appropriately masked and etched to form one or more ring contact structures.

Figure 17:
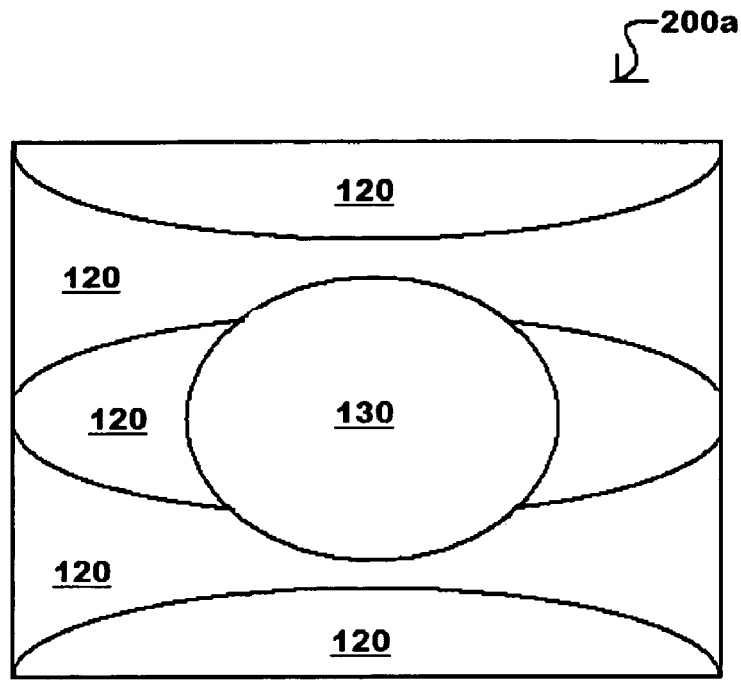
Figure 18:
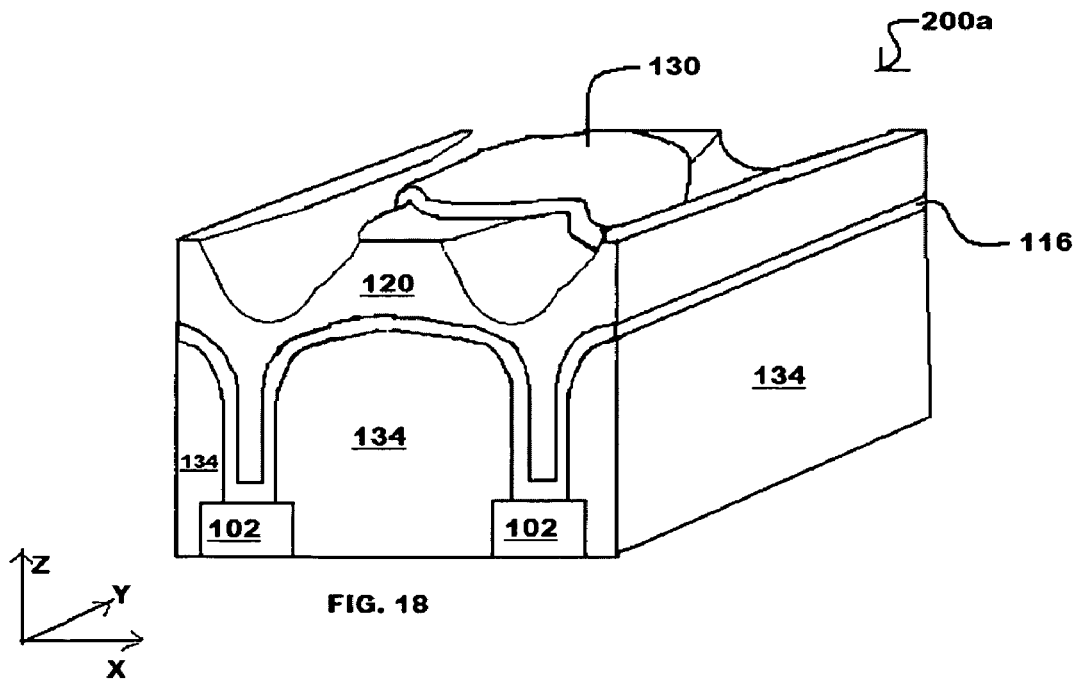
Figure 19:
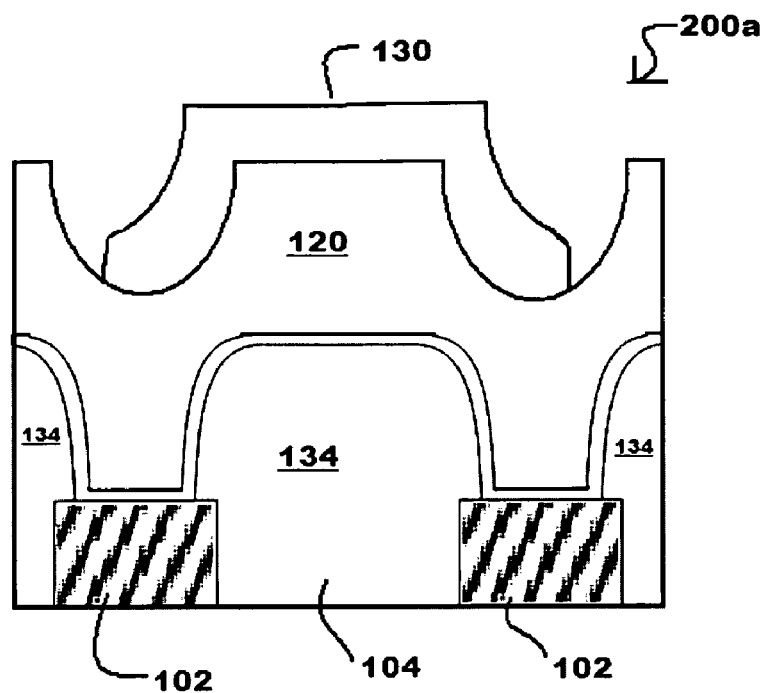

In the embodiment of the invention shown in FIGS. 17-19, a disposable segment mask 130 is next formed over the second insulating layer 120. A top view of the structure 200a including segment mask 130 over second insulating layer 120 is shown in FIG. 17. FIGS. 18-19 illustrates a perspective view and a side elevational cross-sectional view along the X-Z plane, respectively, of the resulting memory cell 200a showing patterned disposable mask 130 of structure 200a shown in FIG. 17. FIG. 19 is a cross-sectional view of the structure 200a shown in FIG. 18 showing segmented mask 130 relative to a top surface of the second insulative layer 120.

The disposable segmented mask 130 may be formed from any material that may be patterned and selectively etched back relative to a surrounding second insulating layer material to form one or more segmented ring contacts or electrodes. In an embodiment of the invention, the segmented mask 130 is formed from silicon nitride or silicon-rich silicon nitride. In another embodiment of the invention the segmented mask 130 is formed from a polyimide or other polymeric material.

Disposable segment mask 130 may be formed from a standard photolithographic technique. In one embodiment, a layer of the material used to form disposable segment mask 130 is formed over the top surface of second insulating layer 120 and this layer is patterned to form disposable segment mask 130 having a particular size, shape, and distribution over the top surface of second insulating layer 120. Patterning may be achieved, for example, using a photoresist process in which a layer of photoresist material is applied and developed over the layer of segment mask material. In an alternative embodiment, the undeveloped portions of the photoresist material may serve as disposable segment mask 130.

Figure 20:
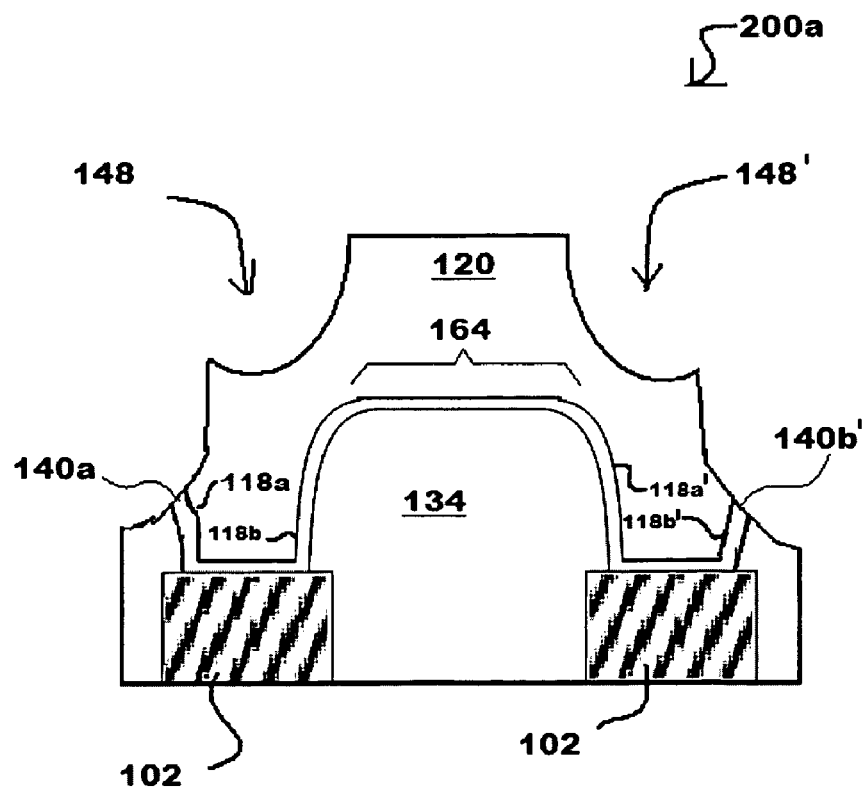

The structure 200a of FIGS. 18-19 is then etched to remove unmasked portions of the second insulating layer 120 along with portions of the conductive layer 116 and portions of the first insulating layer 104 underlying the unmasked portions of second insulating layer 120. The resulting structure is schematically illustrated as structure 200a in FIG. 20, which shows second opening or openings 148, 148' formed by the etching process. Etching processes analogous to the etching processes used to form first opening or openings in the first insulating layers 104 may be used to form the second opening or openings 148, 148'. The etching process segments and isolates a portion of the conductive sidewall spacers 118a, 118b' of the conductive layer 116. FIG. 20 illustrates the memory cell 200a shown in FIGS. 18-19, respectively, after etching to expose portions of the conductive sidewall spacers 118a and 118b'. Removal of portions of conductive sidewall spacers 118a and 118b' has the effect of reducing the surface area of the uppermost surface of conductive layer 116. As described more fully hereinbelow, the remaining portion of the uppermost surface of conductive layer 116 ultimately defines the area of contact with a subsequently-formed variable resistance material. Inclusion of disposable segment mask 130 in the process flow thus enables a reduction in contact area.

In an embodiment of the invention, the etch process etches through the second insulating layer 120 to expose and etch a portion of the conductive layer 116. The etch process is continued to further remove a portion of the first insulating layer 104 or 134, and to thereby expose conductive sidewall spacers 118a, 118b'. A portion of the first insulating layer 104 or 134 not protected by segmented mask 130 is etched once the portion of the conductive layer 116 not protected by segmented mask 130 is removed. The etch of the first insulating layer 104 or 134 is stopped above lower electrode top surface 132. The resulting structure including second opening or openings 148, 148' is shown as structure 200a in FIG. 20.

As is shown in FIG. 20, etching removes a portion of the conductive sidewall spacers 118a, 118b' and leaves a portion of each that extends upwardly from the first opening bottom surface 114 to a second height h that is less than original conductive sidewall spacer first height H, thereby defining a second conductive region. After the etch process is completed, the segment mask 130 (or the remaining undeveloped photoresist layer) is stripped using conventional techniques to form structure 200a shown in FIG. 20.

As is shown in FIG. 20, the etching of each of the second insulating layer 120, the conductive layer 116 and the first insulating layer 104 or 134, respectively forms the second opening or openings 148, 148' that may be filled with a third insulating layer 142. As defined herein, the terminology "second opening" refers to one or more second openings.

Figure 21:
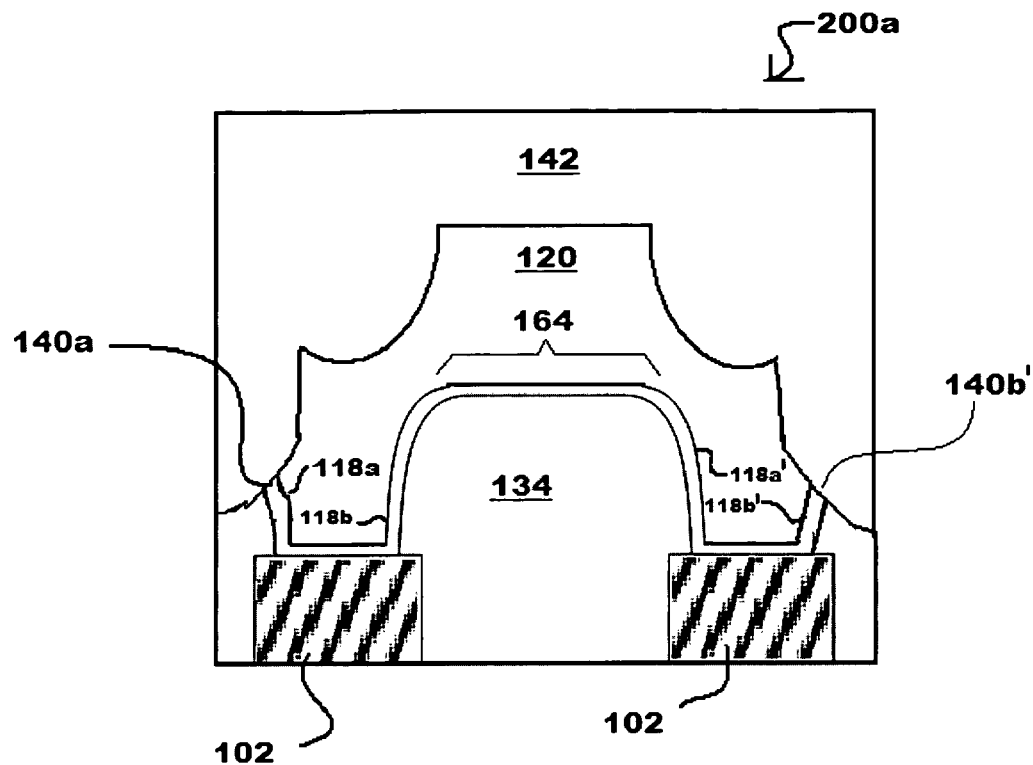

After forming the second opening 148, a third insulating layer 142 is then deposited onto the structure 200a shown in FIG. 20 to form the structure 200a shown in FIG. 21. FIG. 21 illustrates the structure 200a of FIG. 20 including the third insulating layer 142 deposited thereon that is thick enough to fill the second opening 148, 148'. The third insulating layer 142 is deposited onto a respective top edge 140a, 140b' of the etched portions of the conductive sidewall spacers 118a, 118b', respectively as well as onto exposed portions of the first and the second insulating layers 104 or 134, and 120, respectively. The third insulating layer 142 may be formed from the same materials as described with reference to first insulating layer 104. First insulating layer 104, second insulating layer 120, and third insulating layer 142 may be formed from the same or materials. All three insulating layers may differ in composition or two or more of the insulating layers may be the same composition. The processing steps associated with forming the third insulating layer 142 may be analogous to those described hereinabove for forming the second insulating layer 120. In an embodiment of the invention shown in FIG. 21, the third layer 142 is deposited to a thickness of about 1000 to 4000 Angstroms.

Planarization is next completed to expose a top portion 162 of the first insulating layer 104 (in its processed form as spacer 134) that was protected by segment mask 130 in an earlier processing step. Planarization entails removal of material to form a planar surface 150 and is continued to a point between horizontal portion 164 of the conductive layer 116 and above exposed edges 140a and 140b' of conductive sidewall spacers 118a and 118b' (see FIG. 21). The planarization step exposes top edges 160 and 160' of conductive sidewall spacers 118b, 118a', respectively, and forms segmented ring contact 166 as shown in side view in FIG. 22. FIG. 24 shows a top view of the structure shown in FIG. 22. Top edges 160 and 160' ultimately determine the area of contact between segmented electrode 166 and a subsequently deposited variable resistance or other active or electrically stimulable material. The overall contact area is reduced by the method of the instant invention because contact surfaces 140a and 140b' of conductive layer 116 are recessed and embedded within surrounding insulator layers and are thus not electrically accessible (see further discussion below).

In addition to reduced contact area, the segmented ring electrode structure 166 is planar, uniform, and adapted to contact a programmable resistance layer deposited thereon in a subsequent step. The instant method provides for low areas of electrical contact with electrode structures having the regular, uniform structure provided by a planar processing technique.

The planarization process may be accomplished, for example, through a CMP (chemical mechanical polishing) process or by dry etching to form top planarized surface 150. The chemical mechanical polishing or dry etching process operates to planarize the top surfaces of the first, second, and third insulating layers 104 (134), 120, 142, respectively, and the conductive sidewall spacers 118b, 118a', respectively to expose at least a portion of the top edge 166 of each spacer 118b, 118a'.

FIGS. 22 and 24 illustrate the memory cell 200a with portions of the first, second, and third insulating layers 104 (134), 120, 142, respectively, and a top edge or edges 160, 160' of conductive sidewall spacers 118b, 118a', respectively, planarized by a planarizing process such as CMP, thereby exposing the top edges 160 and 160' of the conductive sidewall portions 118b, 118a'.

In operation, the associated top edges 160, 160' of the conductive sidewall spacers 118b, 118a' are flush with planarized surface 150 to define a contact region of segmented electrode 166 with a subsequently deposited active or memory material layer. The top edges 160, 160' are positioned to extend to a third height above the bottom 114 of the first opening 112, 112' that is between the first height H (shown and described with reference to FIG. 14) and the second height h (shown and described with reference to FIG. 20) Hence, substantially all electrical communication between the conductive layer 116 and the memory material occurs through the associated top edge 160, 160' of the conductive sidewall spacers 118b, 118a'. The area of contact between each lower electrode 102 and the memory material is thus defined by the top edge 160 of an associated conductive sidewall spacer 118b, 118a'.

As used herein the "area of contact" is the portion of the surface of an electrical contact through which electrical communication with a subsequently formed active, electrically stimulable, or memory material layer such as a programmable resistance material (PRM) occurs. While not wishing to be bound by theory it is believed that reducing the size of the area of contact reduces the volume of the memory material programmed, thereby reducing the total current needed to program the memory device. The reduction in contact area is beneficial because it reduces the volume of the PRM that must be programmed to produce a change in resistance and as a result, the energy required for programming is decreased.

As noted, in the embodiment shown in FIGS. 22 and 24, substantially all electrical communication between a subsequently deposited memory material layer and conductive layer 116 occurs through all or a portion of edges 160, 160'. Hence, the area of contact between the conductive layer 116 and the memory material is at least a portion of the edge 166 of the conductive sidewall spacer 118b, 118a' defining a contact area 170 that is thus very small and is proportional to the width of the edge 160, 160' adjacent to the memory material. The exposed top edges 160, 160' form an upper portion of segmented ring contact 166 having the width dimension "W" along the y-dimension of the x-y plane as shown in FIG. 24.

The contact area 170, i.e. width dimension W of the edge 160, 160', may be reduced even further in accordance with the instant invention by additional masking and lithography steps as shown in FIGS. 25-26. The width dimension of the segmented ring electrode may be reduced by additional masking, etching, filling and planarization steps analogous to those described hereinabove that are used to reduce the contact area of conductive layer 116. Additional steps permit further reduction in the exposed area of edges 160 and 160' by removing or embedding portions thereof as described hereinabove.

In FIGS. 25-26, each conductive sidewall contact edge 160, 160' initially has a substantially uniform width "W" (dimension of the spacer along the y-dimension of the x-y plane as shown in FIG. 24). In order to further decrease the contact area 170 between each conductive sidewall contact edge 160, 160' and the subsequently deposited memory material, each conductive sidewall contact edge 160, 160' may be further processed so that additional portions of the exposed edges 160 and 160' are removed by a mask such as the mask 172 shown in FIG. 25., and etching of the planarized surface 150 in a manner analogous to the etching processes used to form first and second openings 112, 112', and 148, 148' respectively. An additional fourth insulating layer 180 may be deposited on top of exposed and etched portions of the planar surface 150 to form the structure 200b shown in FIG. 26. The structure 200b may then be planarized to complete the segmented ring contact structure 166. The fabrication process described with reference to FIGS. 25-26 may be repeated a desired number of times to reduce the contact area 170 to desired dimensions, thereby further reducing programming current adjacent to subsequently deposited memory material. Reducing the exposed portions of the exposed conductive sidewall spacer edge 160, 160' adjacent the memory material reduces the area of contact 170 between the conductive sidewall spacer edge 160, 160' and the memory material.

In an embodiment of the invention illustrated in FIG. 23, a portion of the memory cell 200a is shown including a programmable resistance material (PRM) layer 190 conformally or non-conformally deposited on the planarized surface 150.

The intersection between the subsequently deposited PRG layer and the segmented ring contact 166 at edges 160 and 160' thus forms the contact area 170 and the volume of the PRM layer extending above the planar surface 150 forms a phase change region.

The PRM layer 190 may be deposited using a conventional deposition process and after deposition, the PRM layer 190 may be planarized through a process such as chemical mechanical polishing (CMP), mechanical polishing or etching (wet or dry).

The memory element of the memory cell 200a generally comprises a volume of memory material over planarized layer 150. Any memory or electronic material may be used in connection with the memory device. In an embodiment of the invention, the volume of memory material is a programmable resistance memory material which is programmable to at least a first resistance state and a second resistance state. The memory material is preferably programmed in response to electrical signals.

The programmable resistance material layer 190 may be any variable voltage or variable resistance material having characteristics that vary when an electrical pulse is applied, such as a phase change material or a resistive oxide. A programmable resistance memory material may be any material that undergoes a chemical or physical transformation in response to an electrical or optical signal, where the transformation is manifested as a variation in electrical resistivity.

The memory material may be a phase change material having one or more structural states having distinguishable electrical resistivity. The structural states may include crystalline states, amorphous states, and states having variable proportions of crystalline and amorphous phase portions. Changes in electrical resistivity may be accomplished through transformations between or among two or more crystalline, amorphous, or partially crystalline and partially amorphous states. Materials that transform between different crystalline states (e.g. states that differ in crystallographic unit cell parameters) are also within the scope of the instant invention. The phase-change materials may be any phase change memory material known in the art. In an embodiment of the invention, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. These alloys will be selected so as to create a material capable of assuming multiple, generally stable, states in response to the stimulus applied.

In one embodiment of the invention, the memory material comprises the elements Te, Ge and Sb. In another embodiment, the memory material consists essentially of Te, Ge and Sb. An example of a memory material which may be used is $Ge_2Sb_2Te_5$ (GST). In another embodiment, the memory material is a composite material comprised of two or more layers having distinct compositions. In still another embodiment, the memory material may be a heterogeneous material that includes discrete regions of one composition dispersed within a surrounding region having a different composition. Heterogeneous materials include, for example, phase-change materials having discrete regions of an insulator material distributed throughout.

The memory material may include at least one transition metal element. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

In another embodiment of the invention, ovonic threshold switching (OTS) materials may be deposited on the planarized surface 150. The operational characteristics and representative OTS materials are discussed, for example, in U.S. Pat. Nos. 6,967,344; 6,969,867; and references therein; the disclosures of which are incorporated by reference herein.

The segmented ring contact device generally has an arcuate or rectilinear columnar structure and includes a top edge remote from a substrate. The top edge is in electrical communication with a memory or other active material and the lower portion of the segmented contact is normally in electrical communication with a row line. The lateral cross-section of the segmented ring contact device may be rectilinear or arcuate. The top edge of the segmented ring contact device is planarized and may be flush with a top surface of a surrounding planarized layer or layers. The top edge of the segmented ring contact may be in contact with an upper programmable resistance layer or a conductive layer deposited on the planarized layer.

The instant invention further includes an array of electronic devices, where each electronic device has a segmented ring electrode structure device as described hereinabove and each electronic device is spatially separated from the others. In one embodiment, the spaces between the electronic devices are occupied by an insulating material.

It is to be understood that the disclosure set forth herein is provided in the form of detailed embodiments described for the purpose of making a full and complete disclosure of the invention, and that such details are not to be interpreted as limiting the true scope of this invention as set forth and defined in the appended claims.

I claim:

1. A method of forming an electronic device comprising:
    providing a substrate, said substrate including a first conductive material and a first insulator formed over said first conductive material, said first insulator having an opening, said opening exposing a top surface of said first conductive material, said opening having a first sidewall surface and a second sidewall surface;
    forming a second conductive material over said opening, said second conductive material contacting said first sidewall surface to form a first conductive region, said first conductive region contacting said first conductive material and extending to a first height above said first conductive material, said second conductive material contacting said second sidewall surface to form a second conductive region, said second conductive region contacting said first conductive material;
    forming a second insulator material over said second conductive material, said second insulator material occupying said opening; and removing a portion of said second insulator material disposed above said second conductive region to expose said second conductive region without exposing said first conductive region.

2. The method of claim 1, further comprising:
removing a portion of said second conductive region to recede said second conductive region to a second height above said first conductive material, said second height being less than said first height.

3. The method of claim 2, further comprising:
forming a third insulator material over said recessed second conductive region; and
removing the portion of said second insulator material disposed above said first conductive region to expose said first conductive region without exposing said recessed second conductive region.

4. The method of claim 3, further comprising:
forming an electrically stimulable material over said exposed first conductive region, said electrically stimulable material being in electrical communication with said exposed first conductive region.

5. The method of claim 4, wherein said electrically stimulable material is a memory material.

6. The method of claim 4, wherein said electrically stimulable material is a programmable resistance material, a phase-change material or a chalcogenide material.

7. The method of claim 4, wherein said electrically stimulable material comprises Se or Te.

8. The method of claim 7, wherein said electrically stimulable material further comprises Ge or In.

9. The method of claim 1, wherein said removing second insulator step includes:
forming a mask over said second insulator material, said mask defining masked and unmasked portions of said second insulator material, said mask being disposed over said first conductive region, said mask not being disposed over said second conductive region; and
etching said unmasked portion of said second insulator material to expose said second conductive region.

10. The method of claim 2, wherein said removing said second conductive region step includes etching.

11. The method of claim 3, wherein said removing second insulator material disposed above said first conductive region step includes:
forming a planar top surface, said planar top surface being positioned at a third height above said first conductive material, said third height being between said first height and said second height, said first conductive region being exposed on said planar top surface.

12. The method of claim 11, further comprising:
forming an electrically stimulable material over said planar top surface, said electrically stimulable material being in electrical communication with said exposed portion of said first conductive region.

13. The method of claim 11, further comprising:
forming a mask over said planar top surface, said mask being disposed over less than all of said exposed portion of said first conductive region;
removing a portion of the unmasked portion of said first conductive region to recede said first conductive region;
forming a fourth insulator material over said recessed first conductive region, said forming fourth insulator step leaving said exposed portion of said first conductive region exposed.

14. The method of claim 3, wherein said first insulator material, said second insulator material, and said third insulator material are selected from one or more of the following materials oxides, nitrides and polymers.

15. The method of claim 1, wherein said first sidewall surface is contiguous with said second sidewall surface.

16. The method of claim 15, wherein said first and second sidewall surfaces cooperate to form a circular or an elliptical geometry.

17. The method of claim 1, wherein said opening has a first sidewall and a second sidewall.

18. The method of claim 17, wherein said first sidewall surface is on said first sidewall and said second sidewall surface is on said second sidewall.

19. The method of claim 17, wherein said first and second sidewall surfaces cooperate to form a rectilinear geometry.

* * * * *